ized under 35

(12) United States Patent  
Fenouillet-Beranger et al.

(10) Patent No.: US 9,165,943 B2  
(45) Date of Patent: Oct. 20, 2015

(54) ON-SOI INTEGRATED CIRCUIT COMPRISING A THYRISTOR (SCR) FOR PROTECTION AGAINST ELECTROSTATIC DISCHARGES

(71) Applicants: Commissariat à l'énergie atomique et aux énergies alternatives, Paris (FR); STMicroelectronics SA, Crolles (FR)

(72) Inventors: Claire Fenouillet-Beranger, Grenoble (FR); Pascal Fonteneau, Theys (FR)

(73) Assignees: COMMISSARIAT Á L'ÉNERGIE ATOMIQUE ET AUX ENERGIES ALTERNATIVES, Paris (FR); STMicroelectronics SA, Montrouge (FR)

( * ) Notice: Subject to any disclaimer, the term of this patent is extended or adjusted under 35 U.S.C. 154(b) by 164 days.

(21) Appl. No.: 13/932,371

(22) Filed: Jul. 1, 2013

(65) Prior Publication Data

US 2014/0015052 A1     Jan. 16, 2014

(30) Foreign Application Priority Data

Jul. 13, 2012   (FR) ..................... 12 56802

(51) Int. Cl.
     *H01L 27/12*      (2006.01)
     *H01L 27/02*      (2006.01)
     *H01L 27/06*      (2006.01)

(52) U.S. Cl.
CPC ........ *H01L 27/1203* (2013.01); *H01L 27/0262* (2013.01); *H01L 27/0296* (2013.01); *H01L 27/1207* (2013.01); *H01L 27/0688* (2013.01)

(58) Field of Classification Search
CPC ............ H01L 27/0262; H01L 27/1203; H01L 27/1207; H01L 27/0296; H01L 27/0688; H01L 27/0259; H01L 27/0266; H01L 29/1012; H01L 27/0277; H01L 29/66363; H01L 29/74
USPC ......... 257/173, 355, 347, 348, 350, 360, 351, 257/369, 356
See application file for complete search history.

(56) References Cited

U.S. PATENT DOCUMENTS 6,121,661 A *   9/2000   Assaderaghi et al. ........ 257/355  
7,732,864 B2 *   6/2010   Kawahara et al. ............ 257/347

(Continued)

FOREIGN PATENT DOCUMENTS

WO     2010112585     10/2010

OTHER PUBLICATIONS

Noel et al., "Multi-$V_T$ UTBB FDSOI Device Architectures for Low-Power CMOS Circuit," IEEE Transactions on Electron Devices, vol. 58, No. 8, pp. 2473-2482 (2011).

*Primary Examiner* — Shouxiang Hu  
(74) *Attorney, Agent, or Firm* — Occhiuti & Rohlicek LLP

(57) ABSTRACT

An integrated circuit includes an UTBOX insulating layer under and plumb with first and second electronic components, and corresponding ground planes and oppositely-doped wells made plumb with them. The wells contact with corresponding ground planes. A pair of oppositely doped bias electrodes, suitable for connecting corresponding bias voltages, contacts respective wells and ground planes. A third electrode contacts the first well. A first trench isolates one bias electrode from the third electrode and extends through the layer and into the first well. A second trench isolates the first bias electrode from one component. This trench has an extent that falls short of reaching an interface between the first ground plane and the first well.

14 Claims, 2 Drawing Sheets

(56) References Cited

U.S. PATENT DOCUMENTS

| | | |
|---|---|---|
| 2006/0027877 A1 | 2/2006 | Inaba |
| 2007/0063284 A1 | 3/2007 | Kawahara et al. |
| 2007/0210418 A1* | 9/2007 | Nakajima ............... 257/547 |
| 2009/0026542 A1* | 1/2009 | Wahl ..................... 257/350 |
| 2013/0242448 A1* | 9/2013 | Salcedo et al. ........... 361/111 |

* cited by examiner

ON-SOI INTEGRATED CIRCUIT COMPRISING A THYRISTOR (SCR) FOR PROTECTION AGAINST ELECTROSTATIC DISCHARGES

RELATED APPLICATIONS

Under 35 USC 119, this application claims the benefit of the priority date of French Application No. 1256802, filed on Jul. 13, 2012, the contents of which are herein incorporated by reference.

FIELD OF INVENTION

The invention relates to integrated circuits, and in particular to integrated circuits produced on a substrate of silicon-on-insulator (SOI) type.

BACKGROUND

SOI technology consists in separating a slender silicon layer (a few nanometers) on a silicon substrate by a relatively thick layer of insulant (a few tens of nanometers as a general rule).

Integrated circuits produced by SOI technology exhibit a certain number of advantages. Such circuits generally exhibit lower electrical consumption for equivalent performance. Such circuits also induce lower parasitic capacitances, which make it possible to improve switching speed. Moreover, the phenomenon of parasitic triggering ("latchup") encountered by MOS transistors in Bulk technology can be avoided. Such circuits therefore turn out to be particularly suitable for applications of SoC or MEMS type. It is also noted that SOI integrated circuits are less sensitive to the effects of ionizing radiations and thus turn out to be more reliable in applications where such radiations may induce operational problems, in particular in space applications. SOI integrated circuits can in particular comprise random-access memories of SRAM type or logic gates.

The reduction in the static consumption of logic gates while increasing their toggling speed forms the subject of much research. In the course of development, certain integrated circuits integrate at one and the same time logic gates with low consumption and logic gates with high toggling speed. To generate these two types of logic gates on one and the same integrated circuit, the threshold voltage of certain transistors of the logic gates with fast access is lowered, and the threshold voltage of other transistors of the logic gates with low consumption is increased. In bulk technology, the modulation of the threshold voltage level of transistors of the same type is performed by differentiating the doping level of their channel. However, in FDSOI (for "Fully Depleted Silicon On Insulator") technology, the doping of the channel is almost zero ($10^{15}$ cm$^{-3}$). Thus, the doping level of the channel of the transistors therefore cannot exhibit any significant variations, thus preventing the threshold voltages from being differentiated in this way. A solution proposed in certain studies in order to produce transistors of the same type with distinct threshold voltages is to integrate different gate materials for these transistors. However, the practical production of an integrated circuit such as this turns out to be technically tricky and economically prohibitive.

In order to have distinct threshold voltages for different transistors in FDSOI technology, it is also known to use a biased ground plane disposed between a thin insulating oxide layer and the silicon substrate. By altering the doping of the ground planes and their bias, it is possible to define a range of threshold voltages for the different transistors. It will thus be possible to have transistors with low threshold voltage termed LVT (typically 400 mV), transistors with high threshold voltage termed HVT (typically 550 mV) and transistors with medium threshold voltage termed SVT (typically 450 mV). To allow the operation of the different transistors, it is necessary to electrically insulate them from one another. Consequently, the transistors are generally surrounded by isolation trenches (designated by the acronym STI for "Shallow Trench Isolation"), which extend as far as the wells.

In a known manner, integrated circuits such as these also include devices for protection against accidental electrostatic discharges (ESD) that might impair these transistors.

The document "Multi-VT UTBB FDSOI Device Architectures for Low-Power CMOS Circuit", published by IEEE Transactions on Electron Devices, IEEE Service Center on pages 2473-2482, in volume 58, No. 8 of 1 Aug. 2011, describes an integrated circuit furnished with first and second FDSOI transistors disposed on a buried insulating layer of UTBOX type. First and second ground planes are disposed plumb with the first and second transistors respectively, under the buried insulating layer. First and second wells exhibit opposite types of doping and are disposed respectively under the first and second ground planes, plumb with them. Different bias voltages bias the first and second wells.

There exists a need for devices for protection against electrostatic discharges affecting integration density only marginally, making it possible to ensure local protection of the integrated circuit, and if possible ensuring protection whatever the polarity of the discharge.

SUMMARY

The invention thus pertains to an integrated circuit such as detailed in the appended claims.

In one aspect, the invention features a manufacture including an integrated circuit. The integrated circuit includes first and second electronic components, a buried insulating layer, of UTBOX type, disposed under and plumb with the electronic components, first and second ground planes made plumb respectively with the first and second electronic components under the buried insulating layer, first and second wells in contact, respectively made plumb and in contact with the first and second ground planes, the first well exhibiting a first type of doping, the second well exhibiting a second type of doping opposite to the first type of doping, first and second bias electrodes in contact respectively with the first and second wells and with the first and second ground planes, the first electrode being suitable for being connected to a first bias voltage and exhibiting the second type of doping, the second electrode being suitable for being connected to a second bias voltage different from the first voltage and exhibiting the first type of doping, a third electrode in contact with the first well and exhibiting a type of doping that is the same as that of the first well, a first isolation trench separating the first and third electrodes and extending through the buried insulating layer and into the first well, and a second isolation trench isolating the first electrode from the first component, and not extending as far as an interface between the first ground plane and the first well.

Some embodiments further include an electrostatic discharge detection device configured to detect an electrostatic discharge, and a control circuit configured to apply a control signal to the third electrode upon the detection of an electrostatic discharge.

Among these are embodiments in which the first electronic component includes a first FDSOI transistor and the second electronic component includes a second FDSOI transistor. These in turn include embodiments in which the first FDSOI transistor is included in the control circuit, embodiments in which one of the FDSOI has a drain and a source, wherein the drain is coupled to a drain coupled electrode selected from the group consisting of the first bias electrode and the second bias electrode, and the source is coupled to a source-coupled electrode selected from the group consisting of the first bias electrode and the second bias electrode, and wherein the source-coupled electrode and the drain-coupled electrode are different bias electrodes, and embodiments in which a first one of the FDSOI transistors is an nMOS transistor and second one of the FDSOI transistors is a pMOS transistor, and those in which the first transistor is disposed between the third electrode and the first bias electrode.

Yet other embodiments include those in which the first bias electrode includes a semi-conducting implant having a dopant concentration at least 50 times greater than a dopant concentration in the first well and the third electrode includes a semi-conducting implant having a dopant concentration at least 50 times greater than a dopant concentration in the first well.

In yet other embodiments, the second isolation trench extends through the buried insulating layer and into the first ground plane to a depth that is less than a depth of the interface between the first ground plane and the first well.

Among other embodiments are those including a third isolation trench isolating the first and second components and extending through the buried insulating layer and into the first well. In some of these embodiments, the first bias electrode is disposed between the third isolation trench and the first transistor. In others of these embodiments, the first transistor is disposed between the first bias electrode and the third isolation trench.

Yet other embodiments include those in which the first bias electrode is in contact with the first isolation trench on a first side thereof, and the third electrode is in contact with the first isolation trench on a second side thereof.

In additional embodiments, an upper part of the third electrode is flush with an upper part of the first isolation trench.

Other characteristics and advantages of the invention will emerge clearly from the description thereof given hereinafter, by way of wholly nonlimiting indication, with reference to the appended drawings, in which:

DETAILED DESCRIPTION OF THE INVENTION

The invention proposes to use, in an integrated circuit, isolation trenches of reduced depth and dimensions so as to produce ESD protection devices for the integrated circuit. Such protection devices, made under the electronic components, are not detrimental to the integration density of the circuit and make it possible to ensure localized protection of these components. The terms implant and implanted area are equivalent throughout the following description.

Figure 1:
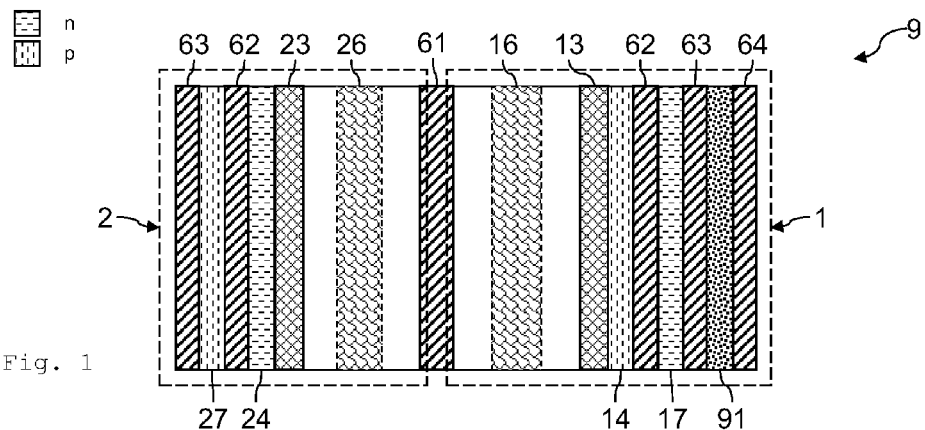
FIG. 1 is a schematic plan view of a portion of integrated circuit according to a first embodiment of the invention.
Figure 2:
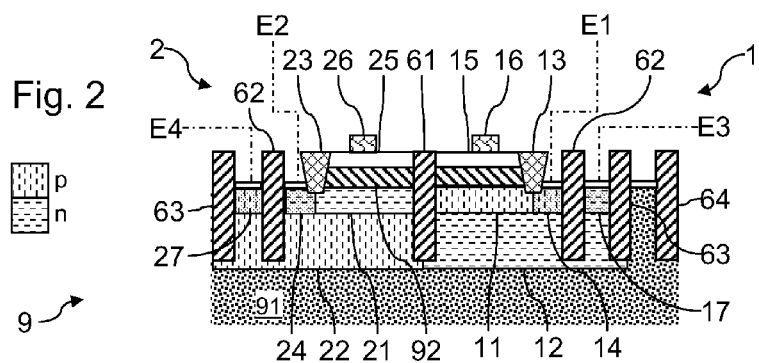
FIG. 2 illustrates a cross-sectional view of the integrated circuit of FIG. 1.

FIG. 1 is a schematic plan view of a portion of an integrated circuit 9 fabricated on SOI, in section at the level of ground planes and implants (or implanted areas). The integrated circuit 9 here comprises a cell comprising electronic components 1 and 2. FIG. 2 is a cross-sectional view of the cell. The electronic components 1 and 2 are produced in a layer of a semi-conducting material, termed the active layer, formed on an insulating layer 92, this insulating layer 92 being formed plumb with a semi-conducting substrate 91 with doping of type p.

In this instance the electronic components 1 and 2 are field-effect transistors of FDSOI type. The components 1 and 2 can also be FEDs (for "Field-Effect Diode"), FERs (for "Field-Effect Resistance"), capacitors or $Z^2$-FETs.

The transistors 1 and 2 are for example pMOS and nMOS transistors respectively. The transistors are generally aligned in a row of cells each including an nMOS transistor and a pMOS transistor. The nMOS transistors of the various cells are then aligned.

The transistors 1 and 2 comprise a source, a drain and a channel, and a gate stack produced plumb with the channel. The source, the drain and the channel of the transistors 1 and 2 are made respectively in semi-conducting active layers 15 and 25. The transistors 1 and 2 comprise respective gate stacks 16 and 26 disposed respectively on the semi-conducting active layers 15 and 25, plumb with the channel. To simplify the drawings, the detailed structure of the active layers is not represented therein. The transistors of the active layer can comprise a channel of weakly doped semi-conducting material, with a concentration of dopants that is substantially equal to the concentration of dopants of the substrate 91. The transistors 1 and 2 also comprise respective source and drain electrodes, not illustrated.

Semi-conducting ground planes 11 and 21 are formed respectively plumb with the transistors 1 and 2, under the buried insulating layer 92. The doping of the ground plane 11 is of type p, that of the ground plane 21 is of type n.

The ground planes 11 and 21 are biased respectively by semi-conducting implants 14 and 24. The implants 14 and 24 exhibit respective dopings of type p and n (and preferably P+, N+ dopings respectively). The biasing of the ground planes 11 and 21 can be performed by way of a bias circuit, not represented here. The implants 14 and 24 are coplanar with the ground planes 11 and 21. Coplanar is understood to mean that it is possible to define a plane parallel to the layer 92 and passing through the zones concerned.

Semi-conducting wells 12 and 22 are formed respectively, plumb with the ground planes 11 and 21. The dopings of the wells 12 and 22 are respectively of type n and of type p. The implants 14 and 24 are in contact respectively with the wells 12 and 22. The implants 14 and 24 thus make it possible at one and the same time to bias the ground planes 11 and 21, and to form inputs for a device for protection against the electrostatic discharges between two potentials.

The wells 12 and 22 are biased respectively by semi-conducting implants 17 and 27. The implants 17 and 27 exhibit respective dopings of type n and p (and preferably N+, P+ dopings respectively). The biasing of the wells 12 and 22 can be performed by way of a bias circuit, not represented here. The transistor 1 is here disposed between the transistor 2 and the implants 14 and 17. In a similar manner, the transistor 2 is here disposed between the transistor 1 and the implants 24 and 27.

A deeply buried well of type n can be made so as to form a separation between the wells 12, 22 and the substrate 91 with doping of type p.

The buried insulating layer 92, in a manner known per se, electrically insulates the transistors 1 and 2 from their ground plane, from their well, and from the substrate 91.

The buried insulating layer 92 formed plumb with the transistors is here of UTBOX type ("Ultra-Thin Buried Oxide Layer"). Thus, the control of the bias of the ground planes 11 and 21 (also called back gates) makes it possible to modulate the respective threshold voltages of the transistors 1 and 2. The insulating layer 92 exhibits for example a thickness of less than or equal to 60 nm, less than or equal to 50 nm, or indeed less than or equal to 20 nm. The insulating layer 92 can be produced in a manner known per se from silicon oxide.

A contact for biasing the substrate 91 is illustrated here, to bias the substrate 91 for example to a ground voltage Gnd.

Deep isolation trenches 61 and 63 are made at the periphery of each of the transistors 1 and 2. The isolation trenches 61 and 63 extend depth-wise through the insulating layer 92 and into the respective wells 12 and 22 for the transistors 1 and 2. A deep isolation trench 64 is here made so as to isolate the contact for biasing the substrate 91.

The transistors 1 and 2 furthermore comprise deep isolation trenches 62. The isolation trenches 62 extend depth-wise through the insulating layer 92 and into the respective wells 12 and 22 for the transistors 1 and 2, without reaching the substrate 91. The wells 12 and 22 extend laterally plumb with the implants 14,17 and 24, 27 respectively, and under the isolation trenches 62. The isolation trenches 62 ensure insulation between the implants 14,17 and 24, 27 respectively. The deep isolation trenches 61 to 64 here advantageously exhibit an identical depth.

Isolation trenches 13 and 23 are made plumb with the contact between the ground planes 11, 21 and the implants 14, 24 respectively. The isolation trenches 13 and 23 are not as deep as the isolation trenches 61 to 64.

The isolation trenches 13 and 23 do not extend as far as their respective wells 12 and 22. The isolation trenches 13 and 23 here pass through the insulating layer 92 and therefore extend into their respective ground planes 11 and 21. The isolation trenches 13 and 23 make it possible to improve the insulation between the transistors 1 and 2 and their implants 14 and 24 while enabling the regions 11 and 21 to be biased.

The wells 12 and 22 can exhibit concentrations of dopants of between $10^{16}$ cm$^{-3}$ and $10^{18}$ cm$^{-3}$. The ground planes 11 and 21 can exhibit concentrations of dopants of between $10^{18}$ cm$^{-3}$ and $10^{19}$ cm$^{-3}$. The wells 12 and 22 can extend to a depth of less than 1 µm and, preferably, less than or equal to 700 nm.

Metallic contacts can be deposited after silicidation directly on each of the implants 14, 17, 24, 27, in order to allow electrical connection of each of them. Advantageously, the implants 14, 17, 24, 27 each exhibit a concentration of dopants at least fifty times, or a hundred times greater than the concentration of dopants of the wells 12 and 22. For example, the implants 14, 17, 24, 27 exhibit concentrations of dopants advantageously greater than or equal to $5*10^{18}$ cm$^{-3}$ and, preferably, of between $10^{19}$ cm$^{-3}$ and $10^{21}$ cm$^{-3}$. These concentrations of dopants are for example substantially equal to the concentrations of dopants of the source or of the drain of the transistors 1 and 2.

The implants 14, 24, 17 and 27 are here made laterally with respect to the transistors 1 and 2. The implant 14 is biased to a first voltage level E1, the implant 24 is biased to a second voltage level E2, the implant 17 is biased to a third voltage level E3 and the implant 27 is biased to a fourth voltage level E4.

A device for protection against electrostatic discharges is included in the integrated circuit 9, plumb with the transistors 1 and 2. The protection against electrostatic discharges is aimed at ensuring protection against the discharges between the voltage levels E1 and E2. This embodiment exhibits reduced sensitivity to accidental triggering (designated by the term latchup).

Figure 3:
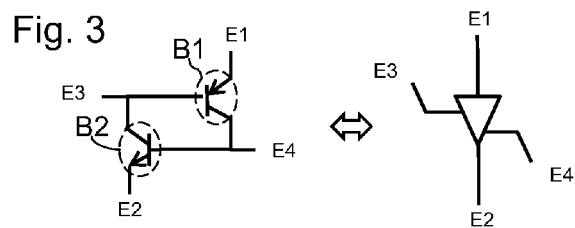
FIG. 3 is an electrical diagram corresponding to a circuit for protecting the integrated circuit.

FIG. 3 is an electrical diagram of the protection device, of the SCR (for semiconductor controlled rectifier) type. Bipolar transistors B1 and B2 are formed.

The bipolar transistor B1 is a pnp transistor and the transistor B2 is an npn transistor.

For the transistor B1:
the emitter is formed by the implant 14, and is at the potential E1;
the base is formed by the well 12, and is at the potential E3;
the collector is formed by the well 22, and is at the potential E4.

For the transistor B2:
the emitter is formed by the implant 24, and is at the potential E2;
the base is formed by the well 22, and is at the potential E4;
the collector is formed by the well 12, and is at the potential E3.

A thyristor potentially having dual-control is thus formed, between the potentials E1 and E2, the signals E3 and E4 being able to be applied to both controls of this thyristor.

Figure 4:
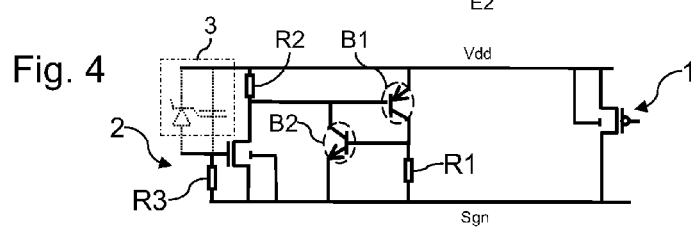
FIG. 4 is an electrical diagram of an exemplary application of the integrated circuit of FIG. 1.

FIG. 4 is an electrical diagram of an exemplary implementation of the first embodiment. The pMOS transistor 1 is here a circuit having to be protected by the transistors B1 and B2. The source of the transistor 1 and its ground plane 11 are connected to a power supply potential Vdd of the integrated circuit 9. The drain of the transistor 1 is connected to a potential of a signal Sgn.

The transistors B1 and B2 here ensure local protection of the pMOS transistor 1 against electrostatic discharges between the power supply potential Vdd and the signal Sgn. Vdd is thus applied as potential E1, Sgn is applied as potential E2. A resistor R1 is made between the collector of B1/the base of B2 and the potential Sgn. A resistor R2 is made between the base of B1/the collector of B2 and the potential Vdd.

The nMOS transistor 2 is here a control circuit for the thyristor formed by the transistors B1 and B2. The transistor 2 has its source connected to the potential Sgn, its drain connected to the collector of B2, and its ground plane 21 connected to the potential Sgn. A resistor R3 is formed between the gate of the transistor 2 and the potential Sgn.

Upon an electrostatic discharge between the potentials Vdd and Sgn, the thyristor formed of the transistors B1 and B2 is turned on by way of the transistor 2. An electrostatic discharge between the potentials Vdd and Sgn is here short-circuited by the thyristor formed, thereby protecting the transistor 1.

The integrated circuit 9 can furthermore advantageously include an additional triggering circuit 3. The additional triggering circuit 3 illustrated includes a capacitor and a Zener diode connected in parallel, between the gate of the transistor 2 and the potential Vdd.

The values of the resistors R1 and R2 can be well resistances, defined in an appropriate manner, by adapting for example the depth of the isolation trenches 62. The level of the voltages for maintaining the control signals of the thyristor formed can be defined by altering the distance separating the implants 17 and 24. It will be possible for the resistor R3 value to be defined by an additional element.

Figure 5:
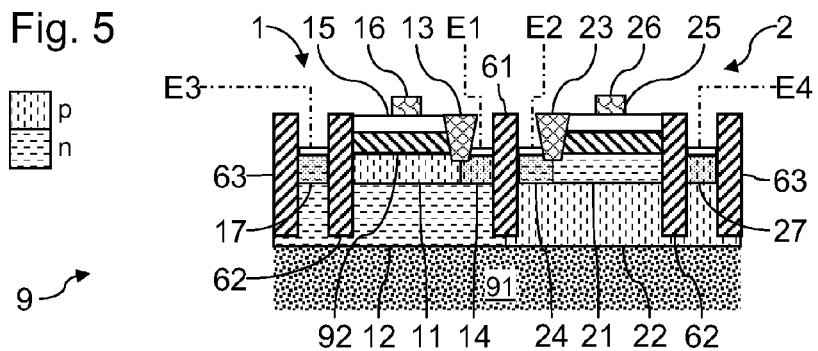
FIG. 5 illustrates a cross-sectional view of an integrated circuit according to a second embodiment.

FIG. 5 is a cross-sectional view of a second embodiment of a cell for an integrated circuit according to a second embodiment. Electronic components 1 and 2 are produced in a layer of a semi-conducting material, termed the active layer, formed on an insulating layer 92, this insulating layer 92 being formed plumb with a semi-conducting substrate 91 with doping of type p. Just as for the first embodiment, the electronic components 1 and 2 are here pMOS and nMOS transistors respectively, for example of FDSOI type.

Semi-conducting ground planes 11 and 21 are formed respectively plumb with the transistors 1 and 2, under the buried insulating layer 92. The doping of the ground plane 11 is of type p, that of the ground plane 21 is of type n.

The ground planes 11 and 21 are biased respectively by semi-conducting implants 14 and 24. The implants 14 and 24 exhibit respective dopings of type p and n (and preferably P+, N+ dopings respectively). The implants 14 and 24 are coplanar with the ground planes 11 and 21.

Semi-conducting wells 12 and 22 are formed respectively, plumb with the ground planes 11 and 21. The dopings of the wells 12 and 22 are respectively of type n and of type p.

The wells 12 and 22 are biased respectively by semi-conducting implants 17 and 27. The implants 17 and 27 exhibit respective dopings of type n and p (and preferably N+, P+ dopings respectively). The implants 14, 24, 17 and 27 are here made laterally with respect to the transistors 1 and 2. The implants 14 and 17 are here made on either side of the transistor 1. The implants 24 and 27 are here made on either side of the transistor 2.

A deeply buried well of type n can be made so as to form a separation between the wells 12, 22 and the substrate 91 with doping of type p.

Deep isolation trenches 61 and 63 are made at the periphery of each of the transistors 1 and 2. The isolation trenches 61 and 63 extend depth-wise through the insulating layer 92 and into the respective wells 12 and 22 for the transistors 1 and 2.

The transistors 1 and 2 furthermore comprise deep isolation trenches 62. The isolation trenches 62 extend depth-wise through the insulating layer 92 and into the respective wells 12 and 22 for the transistors 1 and 2, without reaching the substrate 91. The wells 12 and 22 extend laterally plumb with the implants 14,17 and 24, 27 respectively, and under the isolation trenches 62. The isolation trenches 62 ensure insulation between the implants 14,17 and 24, 27 respectively. The deep isolation trenches 61 to 63 here advantageously exhibit an identical depth.

Isolation trenches 13 and 23 are made plumb with the contact between the ground planes 11, 21 and the implants 14, 24 respectively. The isolation trenches 13 and 23 are not as deep as the isolation trenches 61 to 63.

The isolation trenches 13 and 23 do not extend as far as their respective wells 12 and 22. The isolation trenches 13 and 23 here pass through the insulating layer 92 and therefore extend into their respective ground planes 11 and 21. The isolation trenches 13 and 23 make it possible to improve the insulation between the transistors 1 and 2 and their implants 14 and 24 while enabling the regions 11 and 21 to be biased.

The implant 14 is biased to a first voltage level E1, the implant 24 is biased to a second voltage level E2, the implant 17 is biased to a third voltage level E3 and the implant 27 is biased to a fourth voltage level E4. Just as in the first embodiment, a device for protection against electrostatic discharges is included in the integrated circuit 9, plumb with the transistors 1 and 2. The protection against electrostatic discharges is aimed at ensuring protection against the discharges between the voltage levels E1 and E2. On account of the more reduced distance between the implants 14 and 24, this embodiment exhibits increased sensitivity to electrostatic discharges.

Figure 6:
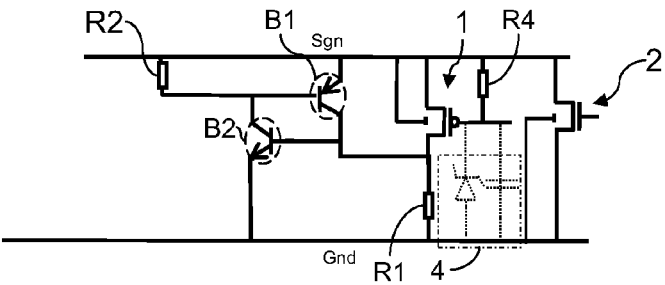
FIG. 6 is an electrical diagram of an exemplary application of the integrated circuit of FIG. 5.

FIG. 6 is an electrical diagram of an exemplary implementation of the second embodiment. The nMOS transistor 2 is here a circuit having to be protected by the transistors B1 and B2. The drain of the transistor 2 is connected to a potential of a signal Sgn of the integrated circuit 9. The source of the transistor 2 and its ground plane 21 are connected to a ground potential Gnd.

The transistors B1 and B2 here ensure local protection of the nMOS transistor 2 against electrostatic discharges between the signal Sgn and the potential Gnd. Sgn is thus applied as potential E1, Gnd is applied as potential E2. A resistor R1 is made between the collector of B1/the base of B2 and the potential Gnd. A resistor R2 is made between the base of B1/the collector of B2 and the potential Sgn.

The pMOS transistor 1 is here a control circuit for the thyristor formed by the transistors B1 and B2. The transistor 1 has its source connected to the potential Sgn, its drain connected to the collector of B1, and its ground plane 11 connected to the potential Sgn. A resistor R4 is formed between the gate of the transistor 1 and the potential Sgn.

Upon an electrostatic discharge between the potentials Sgn and Gnd, the thyristor formed of the transistors B1 and B2 is turned on by way of the transistor 1. An electrostatic discharge between the potentials Sgn and Gnd is here short-circuited by the thyristor formed, thereby protecting the transistor 2.

The integrated circuit 9 can furthermore advantageously include an additional triggering circuit 4. The additional triggering circuit 4 illustrated includes a capacitor and a Zener diode connected in parallel, between the gate of the transistor 1 and the potential Gnd.

Figure 7:
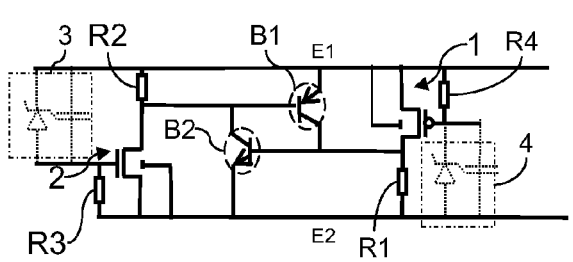
FIG. 7 is an electrical diagram of another exemplary application of the integrated circuit of FIG. 1.

FIG. 7 is an electrical diagram of another application of an integrated circuit according to the invention. In this embodiment, the transistors 1 and 2 are intended to control the transistors B1 and B2 formed, so as to ensure centralized protection for other components, between the potentials E1 and E2. The transistor 2 repeats the detailed configuration with reference to FIG. 3. The transistor 1 repeats the detailed configuration with reference to FIG. 6. In this embodiment, the transistor 1 or the transistor 2 can apply a command turning on the thyristor formed. The electrical diagram illustrates additional triggering circuits 3 and 4, such as detailed with reference to FIGS. 3 and 6.

Figure 8:
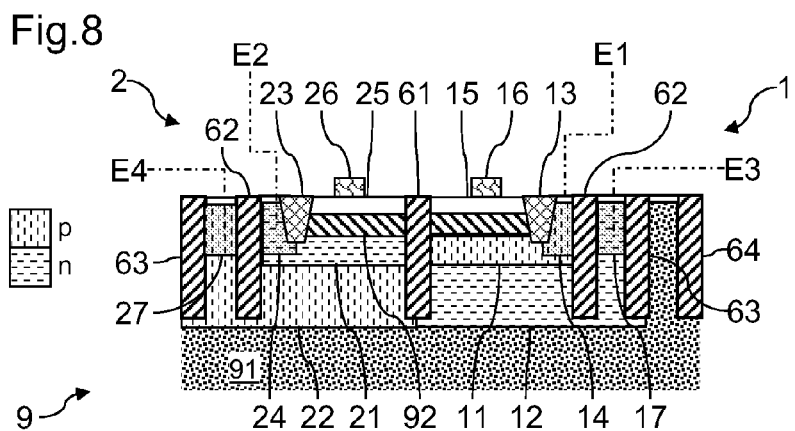
FIG. 8 illustrates a cross-sectional view of a variant of the integrated circuit of FIG. 1.

FIG. 8 is a cross-sectional view of a variant of the invention, here applied to the first embodiment. As a variant, a resumption of epitaxy can be performed on the implants 14, 24, 17 and 27, to avoid the difference in altitude with the active layers 15 and 25. In this example, the implants 14 and 24 extend more deeply than the layer 92, and more deeply than the isolation trenches 13 and 23.

Although, structurally, the thyristors formed and illustrated exhibit two control electrodes, the invention can also be implemented by forming a single control electrode.

As a variant, an nMOS can be produced on a p-doped ground plane, and/or a pMOS can be produced on an n-doped ground plane.

The invention claimed is:

1. A manufacture comprising an integrated circuit, said integrated circuit comprising first and second electronic components, a buried insulating layer of UTBOX type, disposed under and plumb with said electronic components, first and second ground planes made plumb respectively with said first and second electronic components under said buried insulating layer, first and second wells respectively made plumb and in contact with said first and second ground planes, said first well exhibiting a first type of doping, said second well exhibiting a second type of doping opposite to said first type of doping, first and second bias electrodes in contact respectively with said first and second wells and with said first and second ground planes, said first electrode being suitable for being connected to a first bias voltage and exhibiting said second type of doping, said second electrode being suitable for being connected to a second bias voltage different from said first voltage and exhibiting said first type of doping, a third electrode in contact with said first well and exhibiting a type of doping that is the same as that of said first well, a first isolation trench separating said first and third electrodes and extending through said buried insulating layer and into said first well, and a second isolation trench isolating said first electrode from said first component, and not extending as far as an interface between said first ground plane and said first well.

2. The manufacture of claim 1, further comprising an electrostatic discharge detection device configured to detect an electrostatic discharge, and a control circuit configured to apply a control signal to said third electrode upon said detection of an electrostatic discharge.

3. The manufacture of claim 2, wherein said first electronic component comprises a first FDSOI transistor and said second electronic component comprises a second FDSOI transistor.

4. The manufacture of claim 3, wherein said first FDSOI transistor is included in said control circuit.

5. The manufacture of claim 3, wherein one of said FDSOI has a drain and a source, wherein said drain is coupled to a drain-coupled electrode selected from the group consisting of said first bias electrode and said second bias electrode, and said source is coupled to a source-coupled electrode selected from the group consisting of said first bias electrode and said second bias electrode, and wherein said source-coupled electrode and said drain-coupled electrode are different bias electrodes.

6. The manufacture of claim 3, wherein a first one of said FDSOI transistors is an nMOS transistor and second one of said FDSOI transistors is a pMOS transistor.

7. The manufacture of claim 1, wherein said first electrode includes a semi-conducting implant having a dopant concentration at least 50 times greater than a dopant concentration in said first well and said third electrode includes a semi-conducting implant having a dopant concentration at least 50 times greater than a dopant concentration in said first well.

8. The manufacture of claim 1, wherein said second isolation trench extends through said buried insulating layer and into said first ground plane to a depth that is less than a depth of said interface between said first ground plane and said first well.

9. The manufacture of claim 1, further comprising a third isolation trench isolating said first and second components and extending through said buried insulating layer and into said first well.

10. The manufacture of claim 3, wherein said first transistor is disposed between said third electrode and said first electrode.

11. The manufacture of claim 9, wherein said first electrode is disposed between said third isolation trench and said first transistor.

12. The manufacture of claim 1, wherein said first electrode is in contact with said first isolation trench on a first side thereof and said third electrode is in contact with said first isolation trench on a second side thereof.

13. The manufacture of claim 9, wherein said first transistor is disposed between said first electrode and said third isolation trench.

14. The manufacture of claim 1, wherein an upper part of said third electrode is flush with an upper part of said first isolation trench.

* * * * *